US009389983B2

(12) United States Patent
Sakallah et al.

(10) Patent No.: US 9,389,983 B2
(45) Date of Patent: Jul. 12, 2016

(54) VERIFICATION OF COMPLEX SYSTEMS THAT CAN BE DESCRIBED BY A FINITE STATE TRANSITION SYSTEM

(71) Applicants: Karem A. Sakallah, Ann Arbor, MI (US); Suho Lee, Ann Arbor, MI (US)

(72) Inventors: Karem A. Sakallah, Ann Arbor, MI (US); Suho Lee, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 131 days.

(21) Appl. No.: 14/093,112

(22) Filed: Nov. 29, 2013

(65) Prior Publication Data

US 2015/0154096 A1    Jun. 4, 2015

(51) Int. Cl.
*G06F 17/50* (2006.01)
*G06F 11/36* (2006.01)

(52) U.S. Cl.
CPC .......... *G06F 11/3604* (2013.01); *G06F 17/504* (2013.01); *G06F 17/505* (2013.01)

(58) Field of Classification Search
CPC .............. G06F 17/504; G06F 17/5045; G06F 17/5009; G06F 8/43; G06F 11/3608; G06F 11/3612; G06F 11/3636; G06F 17/5031; G06F 2217/84; G06F 8/313; G06F 8/434
USPC ......................................... 703/13, 14, 15, 23
See application file for complete search history.

(56) References Cited

U.S. PATENT DOCUMENTS

2005/0022144 A1* 1/2005 Wang .................... G06F 17/504
716/106
2013/0145328 A1  6/2013 Andraus

OTHER PUBLICATIONS

Andraus_2008 (Reveal: A Formal Verification Tool for Verilog Designs. In International Conference on Logic for Programming, Artificial Intelligence, and Reasoning (LPAR'08), vol. LNCS 5330, pp. 343-352, Doha, Qatar, Nov. 2008).*
Andraus_2006 (Refinement Strategies for Verification Methods Based on Datapath Abstraction, In Asia and South Pacific Design Automation Conference (ASP-DAG), pp. 19-24, Yokohama, Japan, Jan. 2006).*
Jiang_2007 (Reachability Analysis of Linear Hybrid Automata by Using CounterExample Fragement Based Abstraction Refinement, Proceedings of the 2007 American Control Conference, New York city, USA, Jul. 11-13, 2007).*

(Continued)

*Primary Examiner* — Kamini S Shah
*Assistant Examiner* — Scott S Cook
(74) *Attorney, Agent, or Firm* — Nixon & Vanderhye P.C.

(57) ABSTRACT

A method including the steps of: generating a system model, the model comprising an initial state, a transition between consecutive states and a property function defining a property that should be met for an allowable state, the initial state, transition function and property function each comprising at least one of data, operations and predicates; generating an abstracted model by approximating at least some of the data, operations and predicates with uninterpreted terms, functions and predicates respectively, to generate at least one abstracted initial state, abstracted transition function and abstracted property function within the abstracted model; performing a complete reachability analysis on the abstracted model to determine whether the system can reach an unallowable abstracted state by following the abstracted transition function; and if not, the system is verified as correct; and if so, unabstracting a trace of the transitions from the abstracted initial state to the unallowable abstracted state.

11 Claims, 8 Drawing Sheets

(56) References Cited

OTHER PUBLICATIONS

Majumdar_2012 (Software Safety and Security: Tools for Analysis and Verifcation, NATO Science for Peace and Security Series D: Information and Communication Security—vol. 33, 2011).*
Edmund Clarke, Orna Grumberg, Somesh Jha, Yuan Lu, and Helmut Veith. Counterexample—Guided Abstraction Refinement. In E. Emerson and Aravinda Sistla, editors, Computer Aided Verification, vol. 1855 of Lecture Notes in Computer Science, pp. 154-169. Springer Berlin I Heidelberg, 2000. 10.1007/10722167 15.*
Niklas Een, Alan Mishchenko, and Robert Brayton. Efficient Implementation of Property Directed Reachability. In Formal Methods in Computer Aided Design (FMCAD'11 ), pp. 125-134, (Oct. 2011 ).*
Timbuk, for Reachability Analysis and Tree Automata Calculations, Nov. 22, 2012, downloaded from http://web.archive.org/web/20121122021621/http://www.irisa.fr/celtique/genet/timbuk.*
Beyer, D., Explicit-Value Analysis Based on CEGAR and Interpolation, Technical Report of Computer Science and Mathematics University of Passau, Germany Dec. 2012.*
Wimmel, H., Applying CEGAR to the Petri Net State Equation Logical Methods in Computer Science vol. 8(3:27)2012, pp. 1-15.*
Driessen, K.A., Counterexample—Guided Abstraction Refinement for Hybrid SFC Verification, RWTH Aachen University, Bachelor Thesis Sep. 2012.*
Bournez, O., Reachability Problems, 3rd International Workshop, RP 2009 Palaiseau, France, Sep. 2009 Proceedings, Springer ISBN 0302-9743.*
Clarke, E.M., Abstraction and Counterexample—Guided Refinement in Model Checking of Hybrid Systems, Carnegie Mellon University, International Journal of Foundations of Computer Science, 14, 4, 583-604, Nov. 2002.*
Wile, B., Functional Verification, ISBN: 0-12-751803-7 2005.*
Edmund Clarke, Orna Grumberg, Somesh Jha, Yuan Lu, and Helmut Veith. Counterexample—Guided Abstraction Refinement for Symbolic Model Checking. J. ACM, 50:752-794, (Sep. 2003).
Edmund M. Clarke. The Birth of Model Checking. In 25 Years of Model Checking, pp. 1-26, (2008).
Edmund M. Clarke and E. Allen Emerson. Design and Synthesis of Synchronization Skeletons Using Branching-Time Temporal Logic. In Logic of Programs, pp. 52-71, (1981).
Edmund M. Clarke, E. Allen Emerson, and A. Prasad Sistla. Automatic Verification of Finite State Concurrent Systems Using Temporal Logic Specifications: A Practical Approach. In POPL, pp. 117-126, (1983).
P. Cousot and R. Cousot. Abstract Interpretation: A unified Lattice Model for Static Analysis of Programs by Construction or Approximation of Fixpoints. In Conference Record of the Fourth Annual ACM SIGPLAN-SIGACT Symposium on Principles of Programming Lan-guages, pp. 238-252, Los Angeles, California, (1977). ACM Press, New York, NY.
Bruno Dutertre and Leonardo de Moura. A fast linear-arithmetic solver for DPLL(T). In Thomas Ball and Robert Jones, editors, Computer Aided Verification, vol. 4144 of Lecture Notes in Computer Science, pp. 81-94. Springer Berlin / Heidelberg, (2006). 10.1007/11817963 11.
Niklas Een, Alan Mishchenko, and Robert Brayton. Efficient Implementation of Property Directed Reachability. In Formal Methods in Computer Aided Design (FMCAD'11), pp. 125-134, (Oct. 2011).
Himanshu Jain, D. Kroening, N. Sharygina, and E. Clarke. Word Level Predicate Abstraction and Refinement for Verifying RTL Verilog. In Proceedings 42nd Design Automation Conference, pp. 445-450, (Jun. 2005).
Mark H. Liffiton and Karem A. Sakallah. Algorithms for computing minimal unsatisfiable subsets of constraints. Journal of Automated Reasoning, 40(1):1-33, (Jan. 2008).
J. Marques-Silva and I. Lynce. On improving mus extraction algorithms. In Proceedings of the 14th International Conference on Theory and Applications of Satisfiability Testing (SAT-2011), pp. 159-173. Springer, (2011).
J. Marques-Silva and Karem A. Sakallah. GRASP-A New Search Algorithm for Satisfiability. In Digest of IEEE International Conference on Computer-Aided Design (ICCAD), pp. 220-227, San Jose, California, Nov. (1996).

J. Marques-Silva and Karem A. Sakallah. GRASP: A Search Algorithm for Propositional Satisfiability. IEEE Transactions on Computers, 48(5):506{521, (May 1999).
Kenneth L. McMillan. Interpolation and SAT-Based Model Checking. In CAV, pp. 1-13, (2003).
R. Jhala et al, "Software Model Checking" ACM Computing Surveys (CSUR), vol. 41, Issue 4, Oct. 2009, pp. 1-57.
M. Sheeran et al, "Checking safety properties using induction and a SAT-solver" Third International Conference on Formal Methods in Computer-Aided Design, FMCAD 2000, Nov. 2000, pp. 1-18.
P. Bjesse et al, "SAT-based Verification without State Space Traversal" Proceedings of the Third International Conference on Formal Methods in Computer-Aided Design, FMCAD '00, Nov. 2000, 18 pages.
E.M. Clarke et al, "SAT-Based Counterexample—Guided Abstraction Refinement" IEEE Transactions on Computer-Aided Design of Integrated Circuits and Systems, vol. 23, No. 7, Jul. 2004, pp. 1113-1123.
R.P. Kurshan, "Computer-Aided Verification of Coordinating Processes: The Automata-Theoretic Approach" Princeton University Press, © 1994 p. 170.
Zaher S. Andraus et al, "Refinement Strategies for Verification Methods Based on Datapath Abstraction", In *Asia and South Pacific Design Automation Conference (ASP-DAC)*, pp. 19-24, Yokohama, Japan, (Jan. 2006).
Zaher S. Andraus, et al., "Reveal: A Formal Verification Tool for Verilog Designs. In International Conference on Logic for Programming", Artificial Intelligence, and Reasoning (LPAR'08), vol. LNCS 5330, pp. 343-352, Doha, Qatar, (Nov. 2008).
Zaher S. Andraus et al., "Automatic Abstraction and Verification of Verilog", Models. In Proc. 41st IEEE/ACM Design Automation Conference (DAC), pp. 218-223, San Diego, California, (Jun. 2004).
Armin Biere, Alessandro Cimatti, Edmund M. Clarke, and Yunshan Zhu. Symbolic Model Checking without BDDs. In Proceedings of the 5th International Conference on Tools and Algorithms for Construction and Analysis of Systems (TACAS '99), pp. 193-207, London, UK, (1999).
Aaron R. Bradley. SAT-Based Model Checking without Unrolling. In Proceedings of the 12th international conference on Verification, model checking, and abstract interpretation (VMCAI' 11), pp. 70-87, Berlin, Heidelberg, (2011).
Aaron R. Bradley and Zohar Manna. Checking Safety by Inductive Generalization of Counterexamples to Induction. In Formal Methods in Computer Aided Design (FMCAD'07), pp. 173-180, (Nov. 2007).
Randal E. Bryant, Shuvendu K. Lahiri, and Sanjit A. Seshia. Modeling and Verifying SystemsUsing a Logic of Counter Arithmetic with Lambda Expressions and Uninterpreted Functions. In Proceedings of the 14th International Conference on Computer Aided Verification (CAV '02), pp. 78-92, London, UK, (2002), Springer-Verlag.
Jerry R. Burch, Edmund M. Clarke, Kenneth L. McMillan, David L. Dill, and L. J. Hwang.Symbolic Model Checking: 1020 States and Beyond. In LICS, pp. 428-439, (1990).
Jerry R. Burch and David L. Dill. Automatic Verification of Pipelined Microprocessor Control.In David L. Dill, editor, Conference on Computer-Aided Verification, vol. 818 of Lecture Notes in Computer Science, pp. 68-80. Springer-Verlag, 1994. Stanford, California, (Jun. 21-23, 1994).
Alessandro Cimatti, Edmund Clarke, Fausto Giunchiglia, and Marco Roveri. NUSMV: A New Symbolic Model Checker. International Journal on Software Tools for Technology Transfer (STTT), 2:410-425, (2000), 10.1007/s100090050046.
Edmund Clarke, Armin Biere, Richard Raimi, and Yunshan Zhu, "Bounded Model Checking Using Satisfiability Solving", Form. Methods Syst. Des., 19:7-34, (Jul. 2001).
Edmund Clarke, Orna Grumberg, Somesh Jha, Yuan Lu, and Helmut Veith. Counterexample—Guided Abstraction Refinement. In E. Emerson and Aravinda Sistla, editors, Computer Aided Verification, vol. 1855 of Lecture Notes in Computer Science, pp. 154-169. Springer Berlin / Heidelberg, 2000. 10.1007/10722167 15.
Kenneth L. McMillan and Nina Amla. Automatic Abstraction without Counterexamples. In TACAS, pp. 2-17, (2003).
Matthew W. Moskewicz, Conor F. Madigan, Ying Zhao, Lintao Zhang, and Sharad Malik. Chaff: Engineering an Efficient SAT Solver. In DAC, pp. 530-535, (2001).

* cited by examiner

```
1.  // Input: Exact transition relation T(X, X+)
2.  // Input: Initial (reset) states I(X)
3.  // Input: Property P(X)
4.  A(X, X+) := abstract(T(X, X+));              // Create initial abstraction
5.  done := false;
6.  while (not done)
7.  {
8.  |   if reachable(I(X), A(X, X+), not P(X))    // Satisfy A and violate P
9.  |   then
10. |   {
11. |   |   feasible := true;
12. |   |   let CE := X_0 → X_1 → ... → X_k be the abstract multi-cycle counterexample
13. |   |   for each segment X_i → X_j in CE
14. |   |   if not T(X_i, X_j)                    // Transition is not feasable
15. |   |   then
16. |   |   {
17. |   |   |   refine(A(X_i, X_j)); feasible := false;  // Tighten abstraction
18. |   |   }
19. |   |   if feasible                           // All transitions satisfy T
20. |   |   then {output CE; done := true}        // Found true violation
21. |   }
22. |   else {output P(X) holds; done := true}    // Proved P holds!
23. }
```

FIG. 4

```
1. trace DP       (T,I,P){
2.    (T̂,Î,P̂) = DP-Abstract(T,I,P);
3.    Δ = 1; // Initialize datapath lemmas
4.    while (true){
5.       ACEX = Reach-    (T̂,Î,P̂,Δ);
6.       if empty(ACEX)
7.         then return empty trace;// P holds
8.       CEX = DP-Concretize(ACEX);
9.        if Feasible(CEX)
10.        then return CEX trace;// P fails
11.       else Δ=Δ && DP-Refine(T̂,Î,P̂);
12.   }
13. }
```

FIG. 5

```
1. trace Reach    (T,I,P){
2.    F_0 = I;
3.    if (F_0 & !P)
4.      then return CE trace;// len(CEX)=0
5.    if (F_0 & T & !P+)
6.      then return CE trace;// len(CEX)=1
7.    k = 1;
8.    F_k = P;
9.    while (true){
10.     F_{k+1} = P;
11.     while (F_k & T & !P+)// CTI
12.       if Reachable(CTI,I)
13.         then return CEX trace;// len(CEX)≥k+1
14.         else Refine(1,k+1);
15.     if (F_i = F_{i-1} for some 2≤i≤k+1
16.       then return empty trace;// P holds
17.     k++;
18.   }
19. }
```

FIG. 6

```
`define W 2
`define WS1 1
`define MAX 2'b11
module example(CLK);
  input wire CLK;
  reg [`WS1:0] X, Y;
  initial begin
   X = `W'd0;
   Y = `W'd0;
  end
  always @ (posedge CLK) begin
   X <= (Y>X)? X :
        ((Y==X) || (X!=`MAX))? (X+`W'd1) : Y;
   Y <= (Y==X)? (Y+`W'd1) :
        ((Y>X) || (X!=`MAX))? Y : X;
  end
  wire P = !(Y>X);
endmodule
```

VERIFICATION OF COMPLEX SYSTEMS THAT CAN BE DESCRIBED BY A FINITE STATE TRANSITION SYSTEM

TECHNICAL FIELD

The technical field relates to the verification of complex hardware or software systems.

BACKGROUND

The verification of hardware or software to ensure that it cannot reach an undesired state becomes increasingly difficult as the complexity of the systems being verified increases.

In this regard verification of a system requires it to be systematically proved that the system is correct across the entire state space. With increasing complexity of systems and increasing datapath width such state space is becoming increasingly large.

Formal hardware verification, for example, involves creating a mathematical model of the hardware and performing logical reasoning on the model to determine if it satisfies or violates certain desired properties. When computationally feasible, it eliminates the need for case-by-case analysis (by simulation or emulation) since it guarantees complete coverage of the design's behavior "space". An example of the successful deployment of formal hardware verification is combinational equivalence checking which seeks to determine if two different implementations of a combinational circuit are functionally equivalent. Formal combinational equivalence checking tools are based on highly scalable satisfiability (SAT) solvers that implicitly explore the vast input space of two combinational circuits to locate an input vector that distinguishes them or to prove that no such input vector exists thus proving their equivalence.

Formal verification of sequential hardware is conceptually similar to that of combinational hardware but significantly more complex. Simply stated, given a sequential design with a state variable vector X, a transition relation $T(X, X^+)$ that defines how a system transitions from one state to the next, an initial (reset) state predicate $I(X)$, and a safety property $P(X)$, the goal is to determine if all states reachable from $I(X)$ satisfy $P(X)$, i.e., to determine if all reachable states are safe.

Thus, the verification determines if, when starting from an initial state I and following the transition function one can ever arrive at a state outside of P. I, T and P can be determined for the system either from the software code in a software system or from the Verilog or other hardware description of a hardware system.

The safety property P, can be a collection of local assertions that must hold true in certain states, or a global predicate on all states to determine, for example, if two implementations are sequentially equivalent. Either way, to answer this question entails performing some type of reachability analysis in the design's state space, a computation that is considered to be inherently intractable except for trivially small designs. The current state of the art in sequential verification is to perform bounded reachability by unrolling the design's transition relation k times for a suitably small k. Such bounded analysis can uncover shallow bugs, i.e., violating states that can be reached in at most k cycles from reset. It is, however, incomplete, in that it is not able to find deep bugs or to prove that all reachable states are safe.

It would be desirable to be able to verify complex systems in a scalable and reliable manner.

SUMMARY

A first aspect provides a method of verifying a system that can be described as a finite state transition system, said system comprising control logic for controlling manipulation of data, said method comprising the steps of:

generating a model of said system, said model comprising an initial state function defining at least one initial state, a transition function defining how said system moves between consecutive states and a property function defining a property that should be met for an allowable state, said initial state function, transition function and property function each comprising at least one of data, operations and predicates;

generating an abstracted model by approximating at least some of said data, operations and predicates with uninterpreted terms, uninterpreted functions and uninterpreted predicates respectively, to generate an abstracted initial state function defining at least one abstracted initial state, abstracted transition function and abstracted property function within said abstracted model;

performing a reachability analysis on said abstracted model to determine whether when starting from said at least one abstracted initial state, said system can reach an unallowable abstracted state by following said abstracted transition function, and:

if said system cannot reach an unallowable abstracted state, said system is verified as correct; and if said system can reach an unallowable abstracted state,
  unabstracting a trace of said transitions from said at least one abstracted initial state to said unallowable abstracted state and determining using said model whether steps of said unabstracted trace are feasible; and
  if steps of said unabstracted trace are not feasible, refining said abstracted model to preclude any infeasible steps and repeating said reachability analysis on said refined abstracted model; and
  if steps of said unabstracted trace are feasible, generating an error.

The present technique recognises the problems associated with performing verification on systems and in particular, on complex systems that transition between states and that in many cases have an exponentially-large state space, such that determining which states the system can be in and whether any of these are bad or not allowed states is a computationally intractable problem which does not scale with increasing size of the system. It also recognises that in many such systems although the data that is manipulated makes up much of the state of the system, the signals which have the largest effect on the system are the control signals and these account for a much smaller portion of the state space. Thus, it uses a technique where the model of the system is abstracted to generate first order logic approximations of the data, operations on the data and predicates. Such a model is acceptable when verifying the system as it is an over approximation such that it will not miss errors, it will simply detect additional "false" errors that are a facet of the model and are not actually errors in the system. Provided that the behaviour of the system is only weakly impacted by the data and that a thorough check can be made on any errors detected to check whether they arise from the model itself or the system, then this can be a very effective and efficient way of approximating many complex systems, enabling large and complex systems to be verified.

Further, it has been found that owing to the effectiveness of this technique in reducing the complexity of the model to be verified a complete reachability analysis is possible on this abstracted model even for complex systems, which allows a complete verification of the system to be performed. In effect by performing the reachability analysis on a simplified approximation of the system, all errors can be detected along with some false errors which arise from the abstraction of the model rather than the system itself. All potential errors can then be checked by the unabstracted model to see whether they are real (feasible) or caused by the abstraction. If the error was caused by the abstraction, the abstracted model can be refined so that it does not generate this error again. In this way the need to perform reachability analysis on a complete complex system is avoided, rather reachability analysis is performed on an approximated system and then the complete model is used just to verify whether the errors are errors of the system or errors generated by the approximation. Furthermore, by continually detecting errors and refining the abstracted model in response to errors that are facets of the model, this allows the model to be continually improved and the full reachability analysis to be performed on an ever improving and yet still simplified model, resulting in an effective way of verifying some very complex systems.

In some embodiments, said error generated comprises a trace of said transitions from said initial state to said unallowable state. This allows the unabstracted (or concrete) model to check whether the transitions which led to the unallowable state are feasible.

In some embodiments, said model further comprises state variables that model said control logic of said system, said state variables not being approximated in said generation of said abstracted model, said method verifying said control logic of said system when controlling said manipulation of data.

As noted previously this technique is particularly effective for complex systems where the behaviour of the system is weakly impacted by the data and depends more on the control signals. This is true for many systems such as microprocessors and some computer programs. The model does not approximate the state variables that model the control logic but only approximates the data, data operations and predicates. In this way the model is able to verify the control logic of this system while it operates controlling the manipulation of the data. The actual data being manipulated is not verified by the method and should be separately verified. This is generally not a problem as many complex hardware systems for example use particular ALUs or FPUs which have been separately verified and it is their use together in new structures and under new control systems, which are provided to increase the efficiency of the system, that need to be verified. In particular, there are many cases where a new version of a system is implemented with improved control but the same data manipulation. This technique will be particularly effective at verifying whether the new system contains any control bugs if it is known that the former system does not.

Although the abstraction of the model makes an exact reachability analysis much simpler than it would be on the model itself, an exact reachability analysis, exploring all reachable states, is still a computationally complex task. To reduce the complexity, it can be useful to perform an approximate reachability analysis, which is approximate in the sense that it computes over-approximations of what is reachable (i.e. it may include states that are unreachable) but will always include all states that are reachable. This is in contrast to an exact reachability analysis which unrolls the transition relation a number of times to identify all the states which are reachable. Nevertheless, the approximate reachability analysis is still complete in that it will either confirm that it is not possible to reach an unallowable state, or detect all unallowable states which can be reached (although these may include some unfeasible unallowable states which are caused by the abstraction only, which can then be used to refine the abstraction).

To reduce the complexity of the reachability analysis, embodiments of the present technique use a complete reachability analysis that comprises:
(a) determining whether each of the at least one abstracted initial state is an allowable state, and if not, determining that said system can reach an unallowable state;
(b) determining whether, when starting from said at least one abstracted initial state, said system can reach an unallowable abstracted state in one transition of the abstracted transition function, and if so, determining that said system can reach an unallowable state; and
(c) determining whether the allowable states include at least one counter example to induction (CTI) state from which an unallowable state can be reached in one transition of the abstracted transition function, and if said at least one CTI is reachable from the at least one abstracted initial state by following the abstracted transition function, then determining that said system can reach an unallowable state.

This corresponds to an inductive method of determining reachability. First, it is checked whether any of the initial states are unallowable. Second, it is checked whether it is possible to move from an initial state to an unallowable state in one transition. If either of these checks finds an unallowable state, then an error trace is generated.

If no unallowable states are found in the first two steps, then a third step checks whether the allowable states include a CTI state from which an unallowable state can be reached in one transition of the abstracted transition function, and if so, whether that CTI state is reachable. If there are no CTI states, then since it is not possible to move from an allowable state to an unallowable state, and the initial states are all allowable, it can be induced that it is not possible to reach an unallowable state from the initial states using the transition function. On the other hand, if there is a CTI state, then it is checked whether that CTI state is reachable using the transition function. If a CTI state is reachable, then an error trace is generated since the system can reach an unallowable state via the CTI state. On the other hand, if all CTI states are not reachable, then it is not possible for the system to reach an unallowable state, since the only allowable states from which it is possible to move to an unallowable state are themselves not reachable.

In this way, it can be determined whether an unallowable state is reachable without actually having to unroll the transition relation a number of times to determine all the reachable states, which would be computationally intensive for a complex system. Rather than searching for all reachable states, the inductive method instead checks the reachability of just the CTI states, which is more efficient.

More particularly, the step of analysing the CTI states may comprise (starting at k=1):
(i) generating a $(k+1)^{th}$ frontier of states representing states reachable from the at least one abstracted initial state in k+1 transitions of the abstracted transition function, where the $(k+1)^{th}$ frontier of states is approximated to include all allowable states;
(ii) determining whether the $(k+1)^{th}$ frontier includes at least one CTI state;
(iii) for each CTI state of the $(k+1)^{th}$ frontier, determining whether the CTI state can be reached from the at least one abstracted initial state in at least k+1 transitions of the abstracted transition function, and:
  if the CTI state can be reached, determining that said system can reach an unallowable state; and
  if the CTI state cannot be reached, refining the $(k+1)^{th}$ frontier of states to eliminate the CTI state, and repeating steps (ii) and (iii) for the refined $(k+1)^{th}$ frontier;

(iv) if there are no more CTI states in the $k^{th}$ frontier, then determining whether the $(k+1)^{th}$ frontier is the same as the $k^{th}$ frontier, and:

if the $(k+1)^{th}$ frontier is the same as the $k^{th}$ frontier, determining that said system cannot reach an unallowable abstracted state by following said abstracted transition function; and if the $(k+1)^{th}$ frontier is not the same as the $k^{th}$ frontier, incrementing k and repeating steps (i) to (iv) for a next frontier.

This provides a systematic, iterative, algorithm for ensuring that all feasible CTI states are detected.

It is possible for this algorithm to detect individual CTI states, and then eliminate the CTI states one at a time from the frontier. However, often there may be a cluster of similar CTI states for which the feasibility can be determined in one step. Therefore, to make the reachability algorithm more efficient, a detected CTI state may be expanded into a group of CTI states prior to performing step (iii) on the expanded group of CTI states.

Also, often the same CTIs may be detected for several different frontiers. Rather than applying the same refinement to each frontier separately, the reachability analysis may when refining the $(k+1)^{th}$ frontier check whether any of the refinements made to earlier frontiers should also be applied to the $(k+1)^{th}$ frontier. By propagating forward any relevant earlier refinements, this avoids the need to repeat the processing for determining the same refinement on a later iteration.

If the reachability analysis detects a feasible CTI state which is reachable from the initial state, then the trace of states to the feasible CTI state is concretized (unabstracted), and its feasibility is checked using the unabstracted model, and if the unabstracted model indicates that it is unfeasible, then the model itself is refined to avoid detecting such unfeasible CTIs in future.

In effect as can be seen embodiments of the present technique use two types of over approximation which allow this complex calculation to be performed in an efficient manner by enabling errors to be detected albeit with false positives. Firstly, the model is approximated, and secondly, an exact reachability analysis is not performed, instead an inductive method is performed as discussed above. There are two refinement loops: an inner loop which refines frontiers of states, which have initially been approximated to the full set of allowable states, to eliminate unreachable CTIs; and an outer loop which refines the abstraction of the model to eliminate reachable CTIs detected by the inner loop based on the abstracted model which are in fact not reachable in the full model. Any errors remaining following both loops are considered real errors in the system being verified. The use of approximation followed with refinement (to block unreachable CTIs and infeasible abstract counterexamples), significantly reduces the computational effort and in many cases avoid the potentially exponential worst case of exact reachability computation.

In some embodiments, the system comprises a hardware design for an electronic circuit;

said step of generating said model of said system comprising:

analysing a design description of said electronic circuit;

extracting design constraints from said design description, said design constraints comprising said initial state function, said transition function and said property function.

As electronic circuits are becoming ever more complex and as their behaviour is often very dependent on the control logic and only weakly impacted by the data, the current technique is particularly effective at verifying such systems.

In other embodiments, said system comprises a software computer program;

said step of generating said model of said system comprising:

analysing said software computer program;

extracting constraints from said software computer program, said constraints comprising said initial state function, said transition function and said property function.

Other systems which can be effectively verified by this method are software systems. These too are often weakly impacted by the data, for example it may not matter what data is stored in a particular register but it is important that that register is read only or only accessible from a particular portion of the processor and thus, the software should not be able to write data to a read only register or allow other accesses which are forbidden by the system. This method is effective at detecting such anomalies and thereby verifying the software. In the software system, the portion of the software representing data to be processed may be abstracted away, while the portion of the software including the instructions for controlling the control flow may remain unabstracted, making the computation more efficient.

In some embodiments, said step of refining said abstracted model comprises:

generating at least one further constraint for said abstracted transition function to preclude said infeasible steps.

When refining the abstracted models, what one is in effect doing is determining that although it appears one can end at a state which in one transition will go to an unallowable state, it may be that when one looks at the complete model one can never arrive at this state as it is forbidden by some of the data predicates for example. In such a case, the transition function needs to be tightened by adding a further constraint to preclude this infeasible step. In this way, the abstracted model can be refined and constrained to more accurately reflect the real system and preclude errors that are simply facets of the abstraction.

In some embodiments, the further constraint comprises a data lemma which indicates a particular data restriction which needs to be applied to the abstracted model.

A second aspect of the present invention comprises a computer program stored on a non transitory recording medium which when executed by data processing apparatus controls the data processing apparatus to perform the methods of the first aspect of the present invention.

The above, and other objects, features and advantages of this invention will be apparent from the following detailed description of illustrative embodiments which is to be read in connection with the accompanying drawings.

BRIEF DESCRIPTION OF THE DRAWINGS

FIG. 4 shows high level pseudo code for an embodiment of the present technique;

FIG. 5 shows a second high level pseudo code example;

FIG. 6 shows a high level pseudo code example for the reachability analysis;

DESCRIPTION OF EXAMPLE NON-LIMITING EMBODIMENTS

Figure 1:
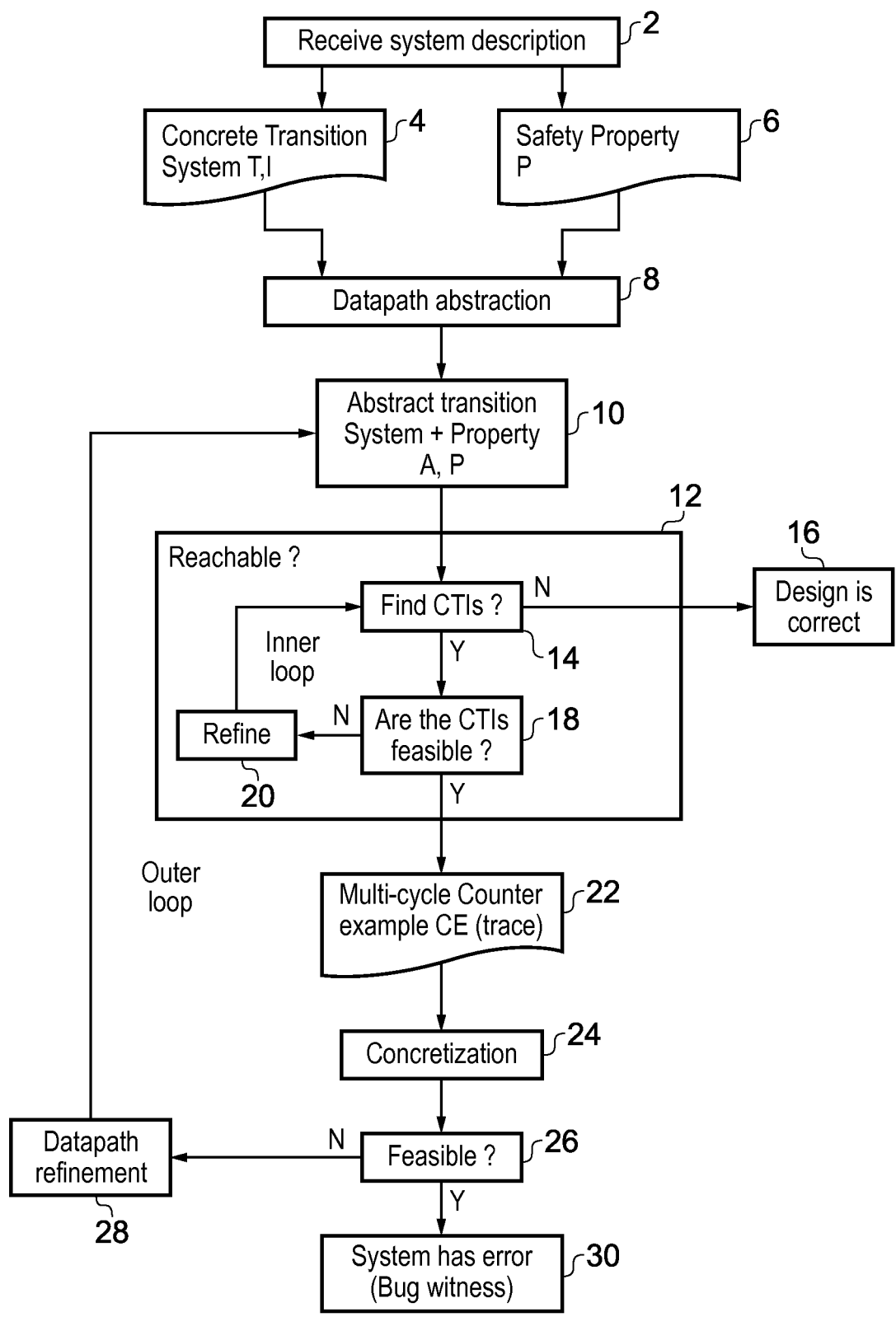
FIG. 1 shows a flow diagram illustrating steps in a verification method according to an embodiment of the present technique.

FIG. 1 shows a flow diagram illustrating steps in the method of the present technique. In an initial step 2, a description of the hardware or software system is received and a model of the system is generated. The description of the system may be either written in hardware description codes such as Verilog or VHDL in the case where the system is an electronic circuit, or it may be a computer program such as a program in a high-level programming language or an assembly language program or binary code in the case where the system is a software system.

The model generated specifies a concrete transition system 4, using an initial state function I representing at least one possible initial state of the system, which are the states at start up or reset, and a transition function T that models the system and defines how the system moves between consecutive states. The model also includes a safety property 6 defined using a property function P which defines a property that should be met for all allowable states. This property function enables one to determine when an error has occurred, that is when one reaches a bad state that the property function defines as not being allowable.

At step 8, datapath abstraction is performed to approximate at least some of the data operations, some of the predicates which determine the behaviour of the system in dependence upon a data value, and the data values with uninterpreted terms. The abstraction is performed only on the datapath portion of the system being modelled, with the control portion (such as the control logic of a hardware design, or the control flow portion of a software system) remaining unabstracted. Thus, at least some of the data operations, predicates and data are replaced by uninterpreted terms such that much of the actual state or data is not included in the model. This greatly reduces the amount of state that the model needs to consider. This is an over approximation of the model and thus, the model may generate more error signals than are actually present within the system itself. However, it will not miss any real errors. Hence, an abstracted model A(I, T) is generated at step 10, comprising an abstracted initial state function defining at least one abstracted initial state, and an abstracted transition function.

At step 12, a reachability analysis is then performed with this abstracted model. Due to the simplification of the model a complete reachability analysis is much more feasible than would be the case for the unabstracted model. The reachability analysis is complete in the sense that it will either confirm that it is not possible to reach an unallowable state, or detect all unallowable states which can be reached. However, it is also an approximate reachability analysis (not an exact reachability analysis), because it overapproximates what is reachable (it may include states that are unreachable but will always include all states that are reachable). Further details of how this reachability analysis are performed are given in FIG. 2. At a general level, the reachability analysis 12 comprises steps 14-20 shown in FIG. 1. Step 14 finds one or more CTI states (counter example to induction states), which are allowable states from which it is possible to transition to an unallowable state in one transition of the abstracted transition function T. If there are no CTI states, then at step 16 the design is verified as correct. On the other hand, if there is at least one CTI state, then at step 18 it is checked whether the at least one CTI state is feasible (that is, whether it is reachable from the abstracted initial states by following the abstracted transition function). If the identified CTI state is not feasible, then at step 20 a refinement is made to the reachability analysis to prevent that CTI state being identified in a subsequent iteration. The reachability analysis then loops back to step 14 to check for more CTIs.

On the other hand, if the identified CTI state is feasible, then an error is identified and at step 22 the reachability analysis outputs a trace indicating how the system can arrive at an unallowable state in one or more transitions from an abstracted initial state. However, as this analysis was performed on an abstracted model, it is possible that these errors could arise solely due to the abstraction, rather than representing a real error in the system being modelled. To check this, the trace is concretised at step 24 in that it is unabstracted and the original model of the system which has not had the data, data operations and predicates replaced with uninterpreted functions, is run with the values from the trace and at step 26 it is determined whether or not the steps leading to the unallowable state using the abstracted model are actually feasible when data is included in the model. In many cases the traces may not actually be feasible when the model is populated with data. For example some of the steps taken to reach the not allowed state from an initial state may not be possible when one takes account of the restrictions implied by a predicate. If they are not feasible, then at step 28 the abstracted model is refined to remove these infeasible steps. This is done by generating one or more data lemmas which constrain the abstracted transition function and do not allow the infeasible steps to be performed in the abstracted model. The method then returns to step 10 and the reachability analysis is then repeated with this updated abstracted model.

In this way, the abstracted model is continually refined and the false positives that arise due to the approximation of the model are eliminated by correcting these approximations using the data lemmas found. This is an efficient way of updating the model and in cases where the system is only weakly data dependent which is true for many systems, an abstracted model which generates no further false positives is reached quickly. Where it is determined at step 26 that actually the steps from the initial state to the unallowable state are indeed feasible, then this indicates that the system does indeed have an error and this is output at step 30.

If, when running the abstracted model, one finds that one cannot reach an unallowed state from an abstracted initial state in one or more transitions and no feasible steps to an unallowed state have been discovered previously then the system is verified as being correct (step 16).

In this way, a complete verification of this system is performed in an effective and efficient manner.

Although, the complete reachability analysis is performed on a simplified abstracted model, it can still be a difficult and computationally intense task. Thus, the present technique in some embodiments performs this complete reachability analysis using an approximation as well in order to improve the efficiency of the complete reachability analysis and make it viable.

As shown in FIG. 1, the verification method comprises nested loops for refining the detection of errors. The inner loop comprises the reachability analysis. By using an inductive iterative method in which CTI states are detected and checked for feasibility and then the reachability analysis is refined to preclude the unfeasible CTI states, errors can be detected more efficiently than an exact reachability analysis in which the transition relation T is unrolled a number of times. The outer loop comprises the refinements made to the abstracted model in order to preclude unfeasible steps leading to unallowable states. It has been found that in practice relatively few iterations of the outer loop are required to determine whether the system is safe or has an error.

Figure 2:
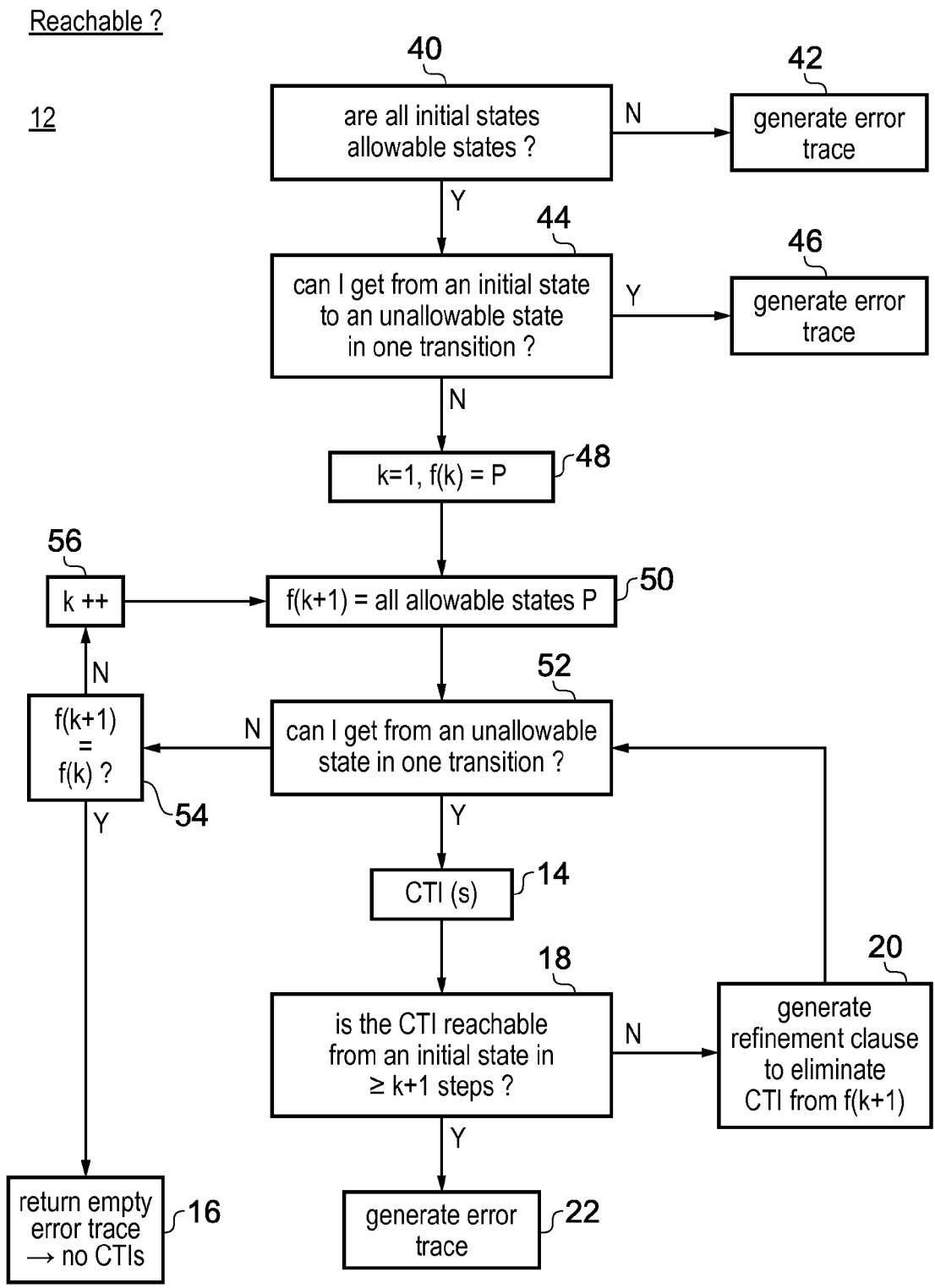
FIG. 2 shows steps of a reachability analysis performed during the method of FIG. 1.

FIG. 2 shows steps in the reachability analysis of an embodiment of the present technique. FIG. 2 includes the general steps 14-22 shown in FIG. 1, but also includes more detailed steps of the reachability analysis. At step 40, it is determined whether all of the abstracted initial states A(I) are allowable states satisfying the safety property function P. If not, then an error trace is generated at step 42. If all initial states are allowable, then at step 44, it is determined whether it is possible to reach an unallowable state failing the safety property function P from the abstracted initial states A(I) in one transition of the abstracted transition function A(T). If so, then at step 46, an error trace is generated. Otherwise, at step 48 a count parameter k is initialised to a value of 1, and a first frontier of states f(k) is determined to include all allowable states P. The reachability analysis then enters the main loop of the procedure.

At step 50, a $(k+1)^{th}$ frontier of states f(k+1) is determined to comprise all allowable states represented by the safety property function P. The $(k+1)^{th}$ frontier represents the states reachable from the abstracted initial states in k+1 transitions of the abstracted transition function. In reality, the states reachable in k+1 transitions comprise fewer states than the allowable states P, and so the initial determination of the frontier f(k+1) represents an overapproximation, but this will then be refined using steps 14, 18 and 20.

At step 52, it is determined whether it is possible to get from the $(k+1)^{th}$ frontier f(k+1) to an unallowable state in one transition of the abstracted transition function A(T). If so, then at least one CTI state is detected at step 14. At step 18 it is determined whether it is possible to reach the CTI state from an initial state in k+1 or more steps. While in reality the CTI state is only a feasible state of the $(k+1)^{th}$ frontier if it can be reached in k+1 steps of the transition steps, it is useful to check whether it can be reached in a greater number of steps, because if so, then it represents an error which would be identified for a later frontier in a subsequent iteration of the loop, and so by flagging it earlier if possible some processing can be saved. In other embodiments, step 18 could only check whether it is feasible to reach the CTI state in k+1 steps.

If the CTI state is feasible (it can be reached in k+1 or more steps) then at step 22 the error trace is generated. The error traces generated in steps 42, 46, 22 may distinguish whether the error represents a 0-step counter example (step 42 representing an initial state being unallowable), a 1-step counter example (step 46 representing an unallowable state being reached from the initial state in one transition) or a (k+1)-step counter example or a counter example having a greater number of steps at step 22.

If the CTI state is not feasible (it cannot be reached in k+1 or more steps), then at step 20 a refinement clause is generated for the $(k+1)^{th}$ frontier to eliminate the CTI state from the frontier. The method then returns to step 52 where the $(k+1)^{th}$ frontier is again checked for CTI states.

If, based on either the original frontier f(k+1) or the refined frontier, step 52 determines that there are no further CTI states, then at step 54 it is determined whether the $(k+1)^{th}$ frontier f(k+1) is the same as the $k^{th}$ frontier f(k). If not, then k is incremented at step 56, and the method returns to step 50 to loop again for the next frontier. In practice, if the system is free from errors, then the frontiers will converge after relatively few steps, and then the method proceeds from step 54 to step 16 where an empty error trace is returned.

Figure 3:
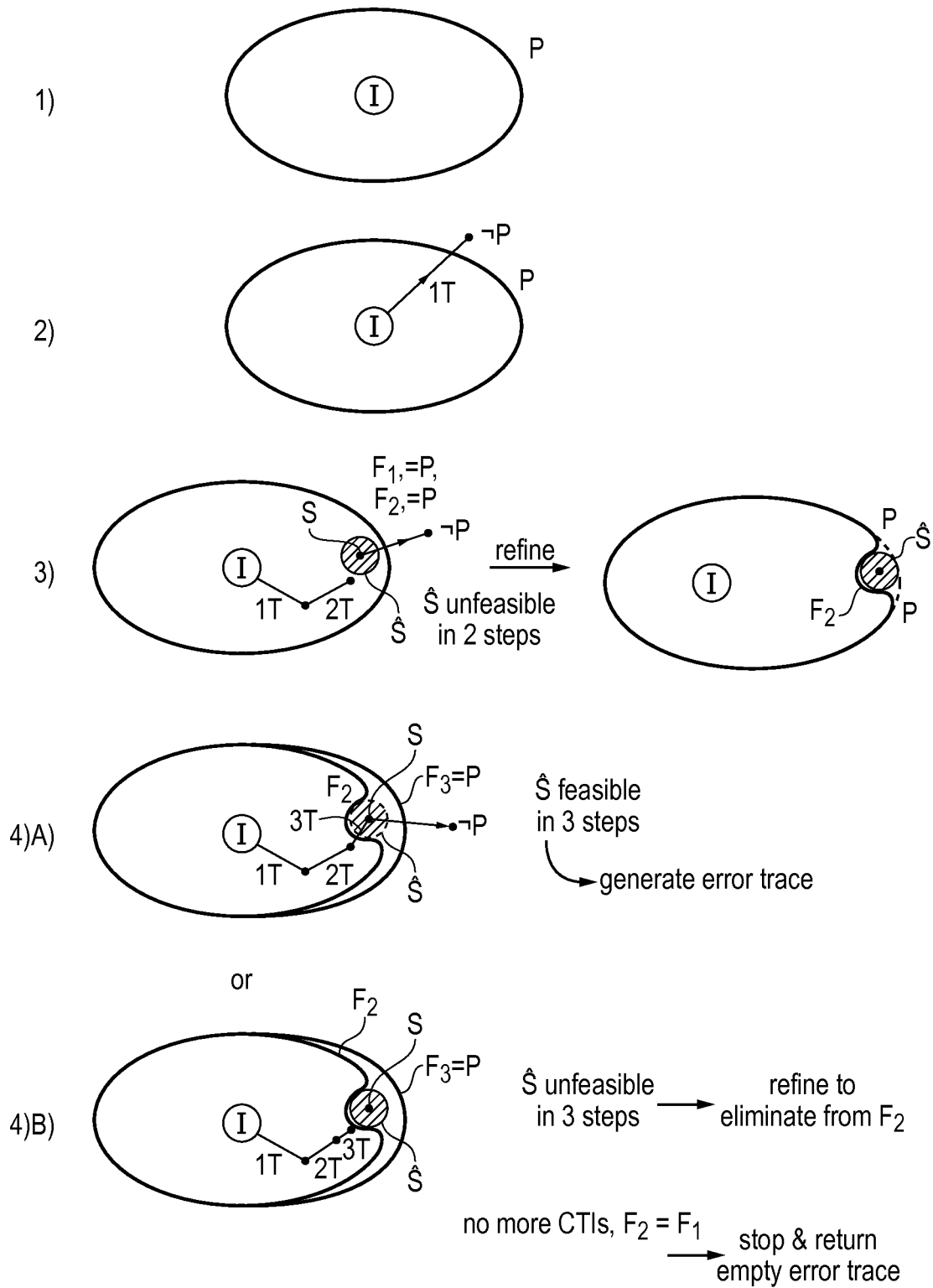
FIG. 3 schematically shows an example of the reachability analysis.

FIG. 3 schematically illustrates how the reachability analysis of FIG. 2 works. Each part of FIG. 3 shows a Venn diagram representing frontiers of states. Part (1) of FIG. 3 represents step 40 which checks whether all initial states I are allowable states. This step provides the basis for the inductive method represented by the subsequent steps. The inductive method induces that, if all initial states are allowable states, and it is not possible to transition in one step from an allowable state to an unallowable state, then it is impossible to reach an unallowable state from the initial states. The subsequent steps then check whether there are any counter examples to this induction—allowable states within P from which a single transition of the transition function can reach an unallowable state ¬ P (the symbol ¬ is being used in this application to indicate that P is not satisfied—i.e. an unallowable state).

Hence, part (2) of FIG. 3 represents step 44 which checks whether it is possible to reach the unallowable state ¬ P from the initial states I in one transition. If this is not possible, then the method proceeds to check further frontiers of states. Part (3) shows the iteration when k=1. Hence, the $(k+1)^{th}$ (second) frontier $F_2$ is determined initially as comprising all allowable states P. A CTI state s is detected at step 52. To reduce the number of refinements required for the frontier, the CTI state s is expanded to form a group of CTI states ŝ prior to checking the group of states for feasibility. For example, the group of states may include other allowable states P which can reach unallowable states in one transition. Step 18 then determines whether the CTI state s or CTI group ŝ can be reached from the initial states I in 2 steps (k+1 steps). In this case, it is determined that the CTI group is unfeasible, and so a refinement is made to the frontier $F_2$ to eliminate the CTI group ŝ from the frontier (see the right hand portion of part (3) of FIG. 3). As the second frontier $F_2$ is not the same as the previous frontier $F_1$, then the method continues for the next frontier $F_3$. $F_2$ may for example be different to $F_1$ because more CTI states have been eliminated from F1 than F2.

Part 4(A) of FIG. 3 shows a first example where a CTI state is determined for frontier $F_2$ which can be reached from the initial states I in three steps (k+1=3). In this case, an error trace is generated because the CTI is feasible. Note that if at step 18 the frontier $F_1$ had been checked for whether any CTIs are reachable in more than k+1 steps, then this error may have been identified in the previous iteration, saving some processing.

On the other hand, Part 4(B) of FIG. 3 shows a second example where only unfeasible CTI states are detected for the frontier $F_2$. In this case, a refinement is made to the frontier once more. When no further CTIs are detected, and the frontier $F_2$ is the same as the previous frontier $F_1$, then the method halts and an empty error trace is returned.

An advantage of this inductive method is that it is not necessary to determine all allowable states which can be reached from the initial states using the transition function, by unrolling the transition function a number of times. Instead, only the CTI states from which unallowable states can be reached in one step need to be checked for feasibility by following the transition function. This reduces the amount of processing required. In combination with the abstraction of the datapath shown in FIG. 1, this allows complex systems to be verified completely with a relatively small amount of processing.

FIG. 4 shows a first example of some high level pseudocode for the datapath abstraction combined with the complete behavioural or reachability analysis of the present technique. In this example, the sequential system is assumed to be modelled by a bit-level transition relation $T(X, X^+)$, where X denotes the current state and $X^+$ denotes the next state, an initial state function I(X) representing one or more initial states, and a desired property P(X) that must hold for all states reachable from I(X). Wide datapath signals and datapath operators (ADD, MUL, etc.) are replaced by uninterpreted terms and uninterpreted functions to create an initial abstraction $A(X, X^+)$ of T (line 4 of the code).

Approximate reachability analysis is now carried out from line 8 on the abstracted system. If the abstract reachability check cannot find a path from the initial state to a state that violates P, the procedure terminates with the conclusion that P holds for all reachable states (line 22). This is because the approximation is an over approximation, so that if no errors are found the system is good, whereas if some are found they may be errors of the system or of the approximation.

If there is an error or counterexample CE detected then this is concretised and each of the segments of the error trace is checked for feasibility using the unabstracted transition function T (line 14). If one or more segments are found to be infeasible (i.e. the abstract transition does not correspond to an actual bit-level transition), datapath refinement is invoked at line 17 to derive constraints on the uninterpreted datapath terms and functions that are used to tighten the abstraction A and another round of reachability analysis is initiated. Otherwise an actual bit-level counterexample demonstrating the violation of P is produced and verification terminates (line 20).

FIG. 5 shows another example of high level pseudocode for the datapath abstraction combined with the approximate (but nevertheless complete) behavioural or reachability analysis. In this example, the initial datapath abstraction is performed by the function DP-abstract which returns first order logic versions of the bit level transition, initial and property formulae in line two of the code. Basically it replaces wide datapath signals with un-interpreted terms and datapath operators and predicates with, respectively uninterpreted functions and predicates. Single bit control signals are not abstracted. In this regard, the abstract formulae are over approximations of the bit level versions and thus represent a sound abstraction.

The procedure then initialises Δ which serves as a database of derived datapath refinement lemmas. Initially, the data lemma Δ is 1 (i.e. there is no refinement of the abstracted model). The reachability computation is carried out by calling a function Reach that operates on the abstracted model. Note that the Reach function takes as a fourth argument a formula representing the learnt datapath lemmas which it augments to all the queries it performs. If the Reach function returns an empty trace then the program terminates with a conclusion that the property holds. However, if the Reach function returns a non-empty abstract trace, ACEX, a concrete bit level version CEX is constructed by function DP-concretise (line 8) and checked for feasibility (line 9). If the transitions are found to be feasible when data is input then CEX is returned as a witness for the violation of the property (line 10). Otherwise a data path refinement procedure is called to refute this spurious counterexample by generating one or more datapath lemmas (line 11) and another round of abstract reachability is invoked using the refined abstracted model.

The hypothesis behind this architecture is that the approximate reachability computation performed in an abstracted version of the design eliminates irrelevant bit level details and thus, is more scalable. More specifically, the abstract reachability procedure is now operating on approximate reachability frontiers in an abstract approximate state space. The combination of these two orthogonal approximations can lead to drastic pruning by generating two types of refining lemmas: reachability refinement lemmas (for refining the state frontiers) and datapath refinement lemmas (for refining the abstracted model). The latter are universal in that they are invariants that tighten the datapath abstraction by relating the uninterpreted terms, functions and predicates. The former are derived during the approximate reachability computation, except they are now in terms with the abstract state variables. They are thus expected to be much stronger than the bit level refinement clauses derived by similar reachability techniques but have not performed the abstraction.

FIG. 6 shows high level pseudocode for the Reach algorithm of FIG. 5. Lines 3-4 represent the basis checking steps 40, 42 for determining whether the initial states I are allowable. Lines 5-6 represent the one-step counter example steps 44, 46 for determining whether a single transition from the initial states can reach an unallowable state !P+. Lines 7 and 8 represent step 48 of FIG. 2. Lines 9-18 represent the main body of the loop in steps 50 onwards of FIG. 2. Line 10 corresponds to step 50. Line 11 checks whether there is a CTI state (step 52). If so, it is determined whether the CTI state is reachable (line 12) and if it is reachable, then an error trace is returned at line 13 (step 22). If the CTI state is not reachable then the frontier $F_{k+1}$ is refined at line 14 (step 20). Lines 11-14 loop until no CTI states are found. Line 15 then checks whether the current frontier equals the previous frontier, and if so an empty trace is returned at line 16. Otherwise, k is incremented at line 17 and the loop returns to line 10.

Figure 7:
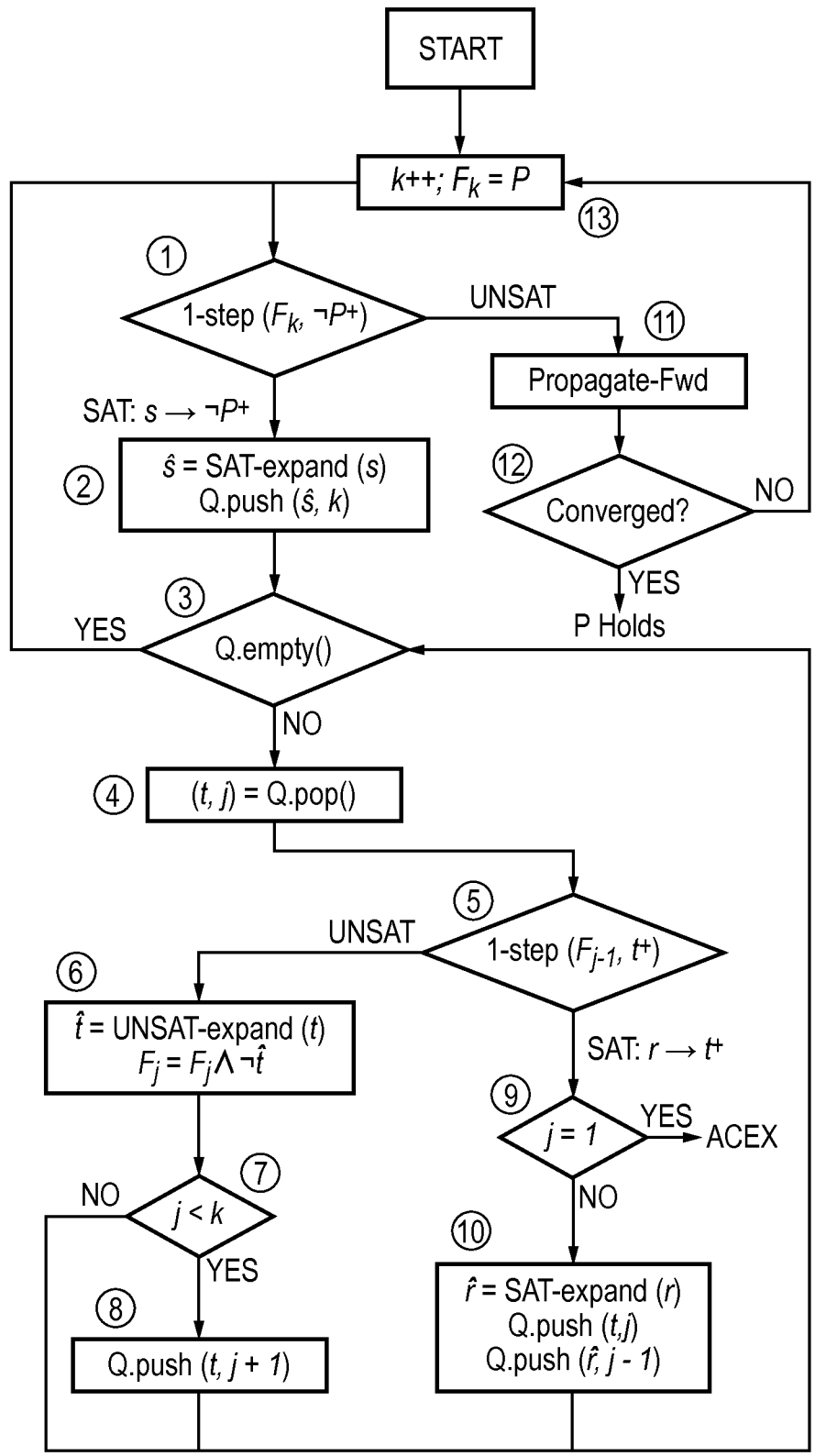
FIG. 7 shows an example implementation of the reachability analysis.

FIG. 7 is a flow diagram indicating an example implementation of steps 48 onwards in the reachability analysis of FIG. 2 or the Reach algorithm of FIG. 6.

The formulae processed by Reach are all in the first order logic of equality with uninterpreted functions, and all reasoning is done using a satisfisability SMT solver. Satisfying solutions returned from the SMT solver are converted to a conjunction of literals which takes several forms:

positive or negated bit level variables;
positive or negated uninterpreted predicates;
equalities or inequalities between uninterpreted constants, terms and functions.

For later frontiers, the step 18 for checking the feasibility of a counter example to induction (CTI) state requires several steps of the transition function to be checked for feasibility. The approach shown in FIG. 7 breaks down this operation into a number of one-step feasibility checks. A queue of "proof obligations" to be performed is maintained, with each proof obligation represented as (t, j), where t is the state or group of states to be checked for feasibility using the transition function, and j represents the frame number. The states of the proof obligation can be represented using a conjunction of literals c(X).

At the start of the analysis, k is initially set to 1 and the first frontier (or frame) $F_k$ for k=1 is set to all allowable states P. At step 1, the function 1-step checks whether it is possible to reach an unallowable state $\neg$ P+ in one step of the transition function from a state within the first frontier $F_k$. The 1-step function calls the SMT solver with a query as to whether one can transition in a single step from a state in that frontier, taking account of deltas (data lemmas previously found), to a state outside of P. That is, the SMT solver is called with the query $F_k \wedge T \wedge \Delta \wedge \neg$ P+ (the symbol ^ represents logical AND).

If a satisfying solution (CTI state) s is found within $F_k$ which can transition to an unallowable state $\neg$ P+ in one step, then at step 2 the CTI state is expanded to remove irrelevant literals using a) cone of influence (COI) reduction, and b) finding MUSes (minimal unsatisfiable subsets), if any exist, of the formula $s \wedge P \wedge T \wedge P+$ (representing other allowable states which can be reached from the CTI state s using the transition function T). The enlarged cube ŝ is now added to the queue Q as a proof obligation (ŝ, k) in frame k, which means "can ŝ be eliminated from $F_k$ by showing that it is unreachable from I along paths whose length is at least k?".

At step 3 of FIG. 7, it is determined whether the queue is empty. An empty queue signifies that the current CTI has been successfully eliminated and the algorithm returns to step 1 to check for the existence of another CTI from the current frame.

At step 4, the reachability computation starts by retrieving a proof obligation (t, j) from the queue. Note that j may be less than k when checking whether an early step on the road to the CTI state ŝ is feasible. At step 5, the 1-step function checks the formula $F_{j-1} \wedge T \wedge \Delta \wedge t_+ \wedge P_+$ to determine if the state t represented by proof obligation (t, j) can be reached in one step from the previous frame j−1. If t is not reachable from frame j−1 then at step 6, the state t is enlarged to a group of states t̄ by finding other MUSes from the equation in step 5. The negation of t̂ is then added as a refinement clause to frame j by setting $F_j$ to $F_j \wedge \neg \hat{t}$, which means that all frames $F_i$ (1≤i≤j) are tightened as a result of the unreachability of t in frame j.

At step 7, it is determined whether j is less than k. If so, then processing of this proof obligation terminates. On the other hand, if j is less than k, then an optional step 8 is performed to add a further proof obligation (t, j+1) to the queue. This step is optional, but it helps to improve performance by finding counterexample traces that are longer than k+1 so that if error of path length k+2 or more is found for these counter examples, then it is not necessary to generate a further frontier of states to detect this error.

If at step 5, it is found that the state t represented by the current proof obligation (t, j) can be reached from the previous frontier $F_{j-1}$ in one transition, then at step 9 it is determined whether j=1. If j=1, then the proof obligation (t, 1) represents the first step from the initial state towards the CTI group ŝ for which a proof obligation was originally added to the queue, and all subsequent steps will already have been checked at step 5 and found to be feasible. Therefore, if j=1 then this indicates that the original CTI group of states ŝ can be reached from the initial states and that an unallowable state can then be reached from the CTI group ŝ. Therefore, this signifies an error and an abstract counterexample trace ACEX is then output and the procedure terminates. The trace ACEX can then be concretised and checked to see whether it is a real error or one caused by the abstraction of the model of the system.

On the other hand, if j does not equal 1, then at step 10 the satisfying solution r to the query in step 5 is enlarged to remove irrelevant literals from r. This is done in a similar way to the enlargement of the CTI state ŝ at step 2. The current proof obligation (t, j) is then returned to the queue so that it can be checked for further solutions to the 1-step function at step 5. Also, a proof obligation (r̂, j−1) is added to the queue so that the previous step along the road to the CTI state ŝ can be checked for reachability.

If there is no error, then eventually all CTIs from the current frontier $F_k$ will be eliminated and the queue becomes empty. The method then proceeds from step 3 to step 1, which will eventually find no more CTIs because these will have been eliminated using the refinement clauses ¬t̂ determined at step 6. At this point, the method proceeds to step 11, which propagates forward refinement clauses from earlier iterations. The refinement clauses t̂ from earlier frontiers are checked to see if they can be moved forward to tighten later frontiers. A refinement clause $\omega \in F_j$, 1≤j≤k indicates that cube ¬ω in frame j+1 is unreachable in one step from frame j, and can thus be eliminated from frame j+1. This is accomplished by propagating clause ω forward: $F_{j+1} = F_{j+1} \wedge \omega$.

At step 12, it is determined whether the frontiers (frames) have converged, i.e. if $F_j = F_j+1$ for some of 1≤j≤k. This check is equivalent to finding that the clause set associated with frame j has become empty. If the frontiers have converged, then it is determined that the safety property P holds and no unallowable states can be reached from the initial states by following the transition function. If the frames have not converged, then at step 13 k is incremented and the next frame (frontier) is created and initialised to P and the procedure is repeated for the next frame to check CTIs corresponding to longer counterexample traces.

Figure 8A:
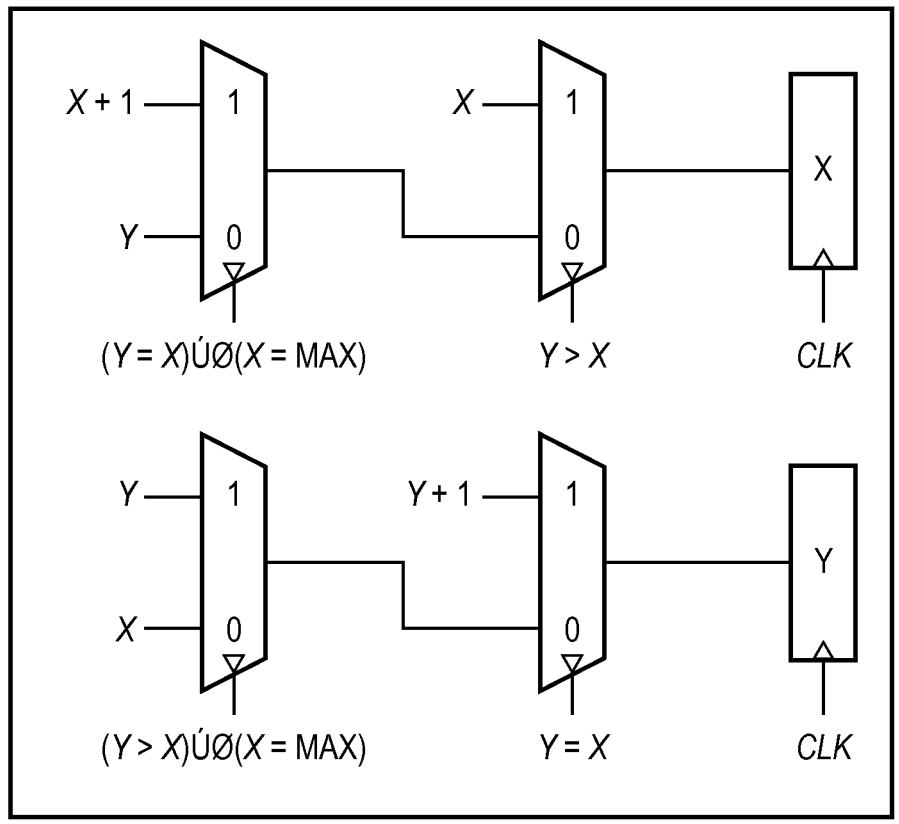
FIGS. 8A to 8D shows a simplified example of verification of a hardware system according to the present technique.
Figure 8D:
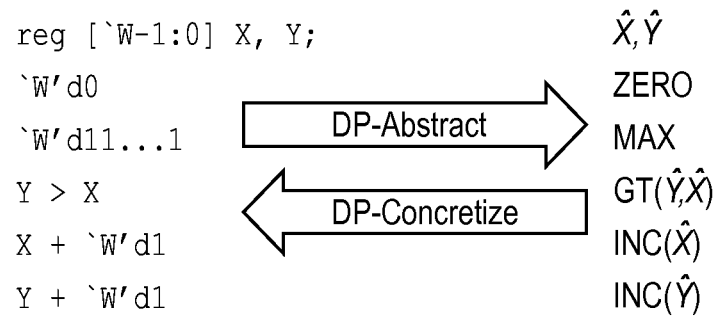
Figures 8B, 8C:
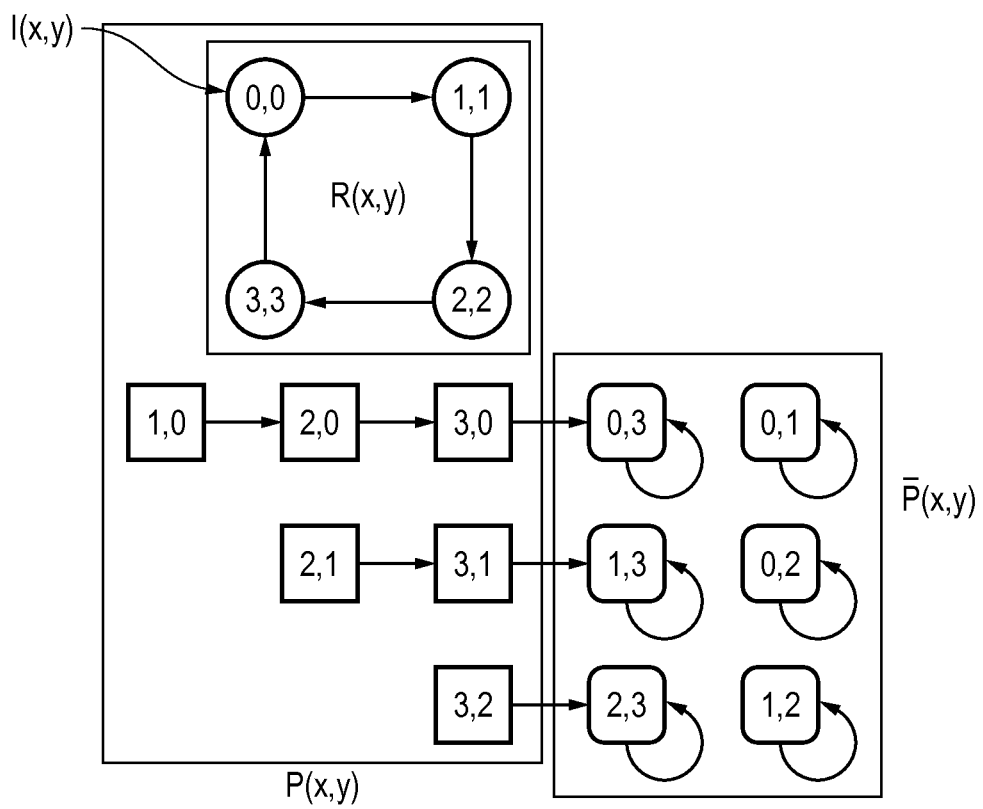

FIGS. 8A to 8B shows for a simple example of how the complete reachability analysis is performed. The example given is shown as a circuit in FIG. 4A and as Verilog code in FIG. 4B. The circuit is one that satisfies the specified property P of Y≤X and the reachable states R(X, Y) are Y=X and the initial state I(X, Y) is 0,0 (the notation 0,0 is used to indicate that X=0 and Y=0, similarly 01 indicates that X=0 and Y=1).

FIG. 8C shows a state transition diagram indicating how the circuit functions going from 0,0 to 1,1 to 2,2 to 3,3 and back to 0,0. However, when looking at the safety property P(X,Y) of Y≤X one can see that there are a lot of states that according to that property P(X,Y) are allowable even if they are never reachable. Also, there are a number of states $\overline{P}(X,Y)$ which are not allowable because they do not satisfy the safety property Y≤X.

If one performs the reachability analysis according to the current technique then first it is checked that the initial state I(X,Y) is allowable (which it is, because when X=0, Y=0 then Y≤X). Also, it is determined whether the initial state 0,0 can transition to an unallowable state in one transition, which it cannot because it will transition to 1,1, which also satisfies Y≤X.

The frontiers F1, F2 are then set to all allowable states, that is the states in box P(X,Y) of FIG. 8C. One then determines for each of these states whether a non-allowable state can be reached in one transition. The transitions are shown by the arrows in FIG. 4C. The transitions depend on whether Y=X. If Y does not equal X, then X is incremented, unless X is at its maximum value (3 in this example), whereupon X is set to Y. If Y does equal X then X is incremented, unless it reaches its maximum value whereupon it is set to 0. Meanwhile, the transition function for Y specifies that if Y=X, then Y is incremented, while if Y is not equal to X, then if Y is larger than X, one leaves Y at its current value, unless X is at its maximum value whereupon one sets Y to X. Looking at the states in the frontier F2 defined by P(X,Y) following the transition outlined above one would reach a non-allowed state where Y>X in one step from the states 3,0; 3,1 and 3,2. Hence, these states are CTI states, and so it is then checked whether these states are reachable from the initial state 0, 0. In this case, the CTI states are not reachable, and so the CTI states are eliminated from the frontier F2.

For this simple example, it may be relatively simple to unroll the transition function a number of times to perform a complete reachability analysis to determine the complete set of reachable states R(X, Y). However, for complex systems such as processor designs and software systems, the processing becomes too complex and intractable. The inductive method using the CTIs explained with respect to FIGS. 8A-8C is more processing efficient because it only checks whether the initial states are allowable, whether a single iteration of the transition function reaches an unallowable state, and whether a number of CTI states are reachable.

FIG. 8D also illustrates an example of performing the datapath abstraction for the simplified circuit example of FIGS. 8A and 8B. The datapath abstraction creates a number of uninterpreted variables, predicates and functions from the corresponding bit-level equivalents. For example, the W-bit variables X and Y are replaced with uninterpreted terms X, Y represented only by the labels X and Y without any knowledge of how many bits the variables have, or what the absolute value of the variables is. Similarly, the values zero ('W'd0) and the maximum value representable using X and Y (3 in the examples of FIGS. 8A-8C, but more generally 'W'd11.1) are replaced with uninterpreted terms ZERO and MAX which have no assumed semantic meaning. The function Y>X and the functions for incrementing X and Y are also replaced with uninterpreted terms GT($\hat{Y}$), INC($\hat{X}$) and INC($\hat{Y}$). The uninterpreted terms and functions do not have any meaning associated with them—the abstract model does not know what they mean and simply treats these as abstract functions.

When the reachability analysis is performed on the abstracted mode, then it may return a zero-step counter-example:

$$ACEX=(X=ZERO) \land (Y=ZERO) \land (GT(Y,X))$$

since it does not know the semantics of the abstract constant ZERO and the abstract predicate GT. However, upon concretization and bit-level feasibility checking (steps 24 and 26 of FIG. 1'), it is determined that this counterexample is spurious. Clearly, when X=0 and Y=0, it is not possible for Y to be greater than X. Therefore, this counterexample has been caused by the abstraction of the model, and not by a real error.

Therefore, a data lemma is derived to eliminate this counterexample:

$$\delta_1 = \neg GT(ZERO, \overline{X})$$

which rules out the possibility of zero being greater than X.

The reachability analysis is then performed again on the abstracted model (constrained by the data lemma). The second call to the reachability algorithm returns a one-step counterexample:

$$(\overline{Y+}=INC(\hat{Y})) \land (GT(\hat{Y},\hat{X}))$$

This counterexample is also spurious, because if X equals Y, then after incrementing both X and Y, it is not possible for Y to be greater than X. Therefore, a second data lemma is then generated to negate this counterexample.

A further call to the reachability algorithm then does not identify any further CTIs. Hence, with just two datapath lemmas, it is possible to prove the safety property of the system in just one reachability iteration regardless of the bit width of the state variables (since the bit width W has been excluded from the abstracted model and consideration of the bit width was not brought in by the data lemmas). This is extremely advantageous because, unlike most existing verification methods whose processing complexity scales exponentially with bit width, the present technique is independent of the bit width, and so even for complex systems having hundreds or thousands of bits of data state, this can be abstracted away to simplify processing while still enabling a complete analysis. By combining the datapath abstraction with the approximate complete reachability analysis based on CTIs, it is possible to verify such complex systems in an efficient way.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the appended claims. For example, various combinations of the features of the following dependent claims could be made with the features of the independent claims.

We claim:

1. A computer-implemented method of verifying a hardware design of an electronic circuit comprising control logic which controls manipulation of data, said method comprising the steps of:

receiving a description of said hardware design of said electronic circuit in a computer; generating, based on said description in said computer a model of said hardware design of said electronic circuit said model comprising an initial state function defining at least one initial state, a transition function defining how said hardware design moves between consecutive states and a property function defining a property that should be met for an allowable state, said initial state function, transition function and property function each comprising at least one of data, operations and predicates;

generating an abstracted model defining data defining an abstracted model of said hardware design by approximating at least some of said data, operations and predicates with uninterpreted terms, uninterpreted functions and uninterpreted predicates respectively, the abstracted model defining data comprising an abstracted initial state function defining at least one abstracted initial state, abstracted transition function and abstracted property function within said abstracted model;

performing a reachability analysis in the computer on said abstracted model to determine whether when starting from said at least one abstracted initial state, said hardware design can reach an unallowable abstracted state by following said abstracted transition function; and if said hardware design cannot reach an unallowable abstracted state, said hardware design is verified as correct; and if said hardware design can reach an unallowable abstracted state, unabstracting a trace of said transitions from said at least one abstracted initial state to said unallowable abstracted state and determining using said model whether steps of said unabstracted trace are feasible; and if steps of said unabstracted trace are not feasible, updating the abstracted model defining data to refine said abstracted model to preclude any infeasible steps and repeating said reachability analysis on said refined abstracted model; and if steps of said unabstracted trace are feasible, generating an error;

wherein the reachability analysis comprises:

determining whether each of the at least one abstracted initial state is an allowable state, and if not, determining that said hardware design can reach an unallowable state;

determining whether, when starting from said at least one abstracted initial state, said hardware design can reach an unallowable abstracted state in one transition of the abstracted transition function, and if so, determining that said hardware design can reach an unallowable state; and without determining all reachable states that can be reached from said at least one abstracted initial state by following said abstracted transition function and without unrolling the abstracted transition function, determining whether the allowable states include at least one counter example to induction (CTI) state which is an allowable state from which an unallowable state can be reached in one transition of the abstracted transition function, and if said at least one CTI state is reachable from the at least one abstracted initial state by following the abstracted transition function, then determining that said CTI state is a counter example to induction and that said hardware design can reach an unallowable state.

2. The method according to claim 1, wherein said error generated comprises a trace of said transitions from said at least one initial state to said unallowable state.

3. The method according to claim 1, wherein said model further comprises state variables that model said control logic of said hardware design, said state variables not being approximated in said generation of said abstracted model, said method verifying said control logic of said hardware design when controlling said manipulation of data.

4. The method according to claim 1, wherein the reachability analysis comprises an approximate reachability analysis.

5. The method according to claim 1, wherein the step of determining whether the allowable states include said at least one CTI state comprises:
   (i) generating a $(k+1)^{th}$ frontier of states representing states reachable from the at least one abstracted initial state in k+1 transitions of the abstracted transition function, where the $(k+1)^{th}$ frontier of states is approximated to include all allowable states;
   (ii) determining whether the $(k+1)^{th}$ frontier includes at least one CTI state;
   (iii) for each CTI state of the $(k+1)^{th}$ frontier, determining whether the CTI state can be reached from the at least one abstracted initial state in at least k+1 transitions of the abstracted transition function, and:
      if the CTI state can be reached, determining that said hardware design can reach an unallowable state; and
      if the CTI state cannot be reached, refining the $(k+1)^{th}$ frontier of states to eliminate the CTI state, and repeating steps (ii) and (iii) for the refined $(k+1)^{th}$ frontier;
   (iv) if there are no more CTI states in the $k^{th}$ frontier, then determining whether the $(k+1)^{th}$ frontier is the same as the $k^{th}$ frontier, and:
      if the $(k+1)^{th}$ frontier is the same as the $k^{th}$ frontier, determining that said hardware design cannot reach an unallowable abstracted state by following said abstracted transition function; and
      if the $(k+1)^{th}$ frontier is not the same as the $k^{th}$ frontier, incrementing k and repeating steps (i) to (iv) for a next frontier.

6. The method according to claim 5, wherein the reachability analysis comprises expanding the at least one CTI state determined in step (ii) to form a group of CTI states, prior to performing step (iii) on the group of CTI states.

7. The method according to claim 5, wherein the reachability analysis comprises refining the $(k+1)^{th}$ frontier by applying at least one refinement made to an earlier frontiers.

8. The method according to claim 1, wherein said step of refining said abstracted model comprises:
   generating at least one further constraint for said abstracted transition function to preclude said infeasible steps.

9. The method according to claim 8, wherein said at least one further constraint comprises a data lemma.

10. A computer program stored on a non-transient medium, which when executed by a computer causes the computer to perform steps in the method according to claim 1.

11. A computer program stored on a non-transient medium, which when executed by a computer causes the computer to perform steps in the method according to claim 5.

* * * * *